(12) United States Patent
Giterman

(10) Patent No.: US 12,326,485 B2
(45) Date of Patent: Jun. 10, 2025

(54) TEMPERATURE COMPENSATION METHOD FOR HALL EFFECT PROXIMITY SENSORS

(71) Applicant: HarcoSemco LLC, Branford, CT (US)

(72) Inventor: Igor Giterman, Woodbridge, CT (US)

(73) Assignee: HarcoSemco LLC, Branford, CT (US)

( * ) Notice: Subject to any disclaimer, the term of this patent is extended or adjusted under 35 U.S.C. 154(b) by 0 days.

(21) Appl. No.: 16/396,713

(22) Filed: Apr. 28, 2019

(65) Prior Publication Data

US 2020/0341076 A1   Oct. 29, 2020

(51) Int. Cl.
*G01R 33/00*   (2006.01)
*B64D 45/00*   (2006.01)
(Continued)

(52) U.S. Cl.
CPC ..... *G01R 33/0082* (2013.01); *B64D 45/0005* (2013.01); *G01D 3/0365* (2013.01);
(Continued)

(58) Field of Classification Search
CPC . B02C 2/00; B04C 11/00; B23K 20/00; B23P 11/00; B60C 11/00; B60G 2204/00; B60R 16/00; B60R 19/00; B62D 3/00; B63B 79/00; B63H 23/00; B64D 45/00; B64D 45/0005; F01D 5/00; F01D 11/00; F01D 17/00; F01D 21/00; F01D 25/00; F02C 3/00; F02C 7/00; F02D 41/00; F02P 7/00; F04D 29/00; F05D 2220/00; F05D 2230/00; F05D 2240/00; F05D 2250/00; F05D 2260/00; F05D 2270/00; F05D 2300/00; F16C 11/00; F16C 17/00; F16C 19/00; F16C 23/00; F16C 27/00; F16C 2360/00; F16C 33/00; F16C 35/00; F16C 41/00; F16C 43/00; F16C 2202/00; F16C 2204/00; F16C 2223/00; F16C 2233/00; F16C 2240/00; F16C 2300/00; F16C 2326/00; F16D 55/00; F16D 66/00; F16J 15/00; F16K 37/00; F23M 5/00; F23M 11/00; F23R 3/00; H01F 17/00; H01F 27/00; H01F 2017/00; H01F 2021/00; H01H 1/00; H01H 2001/00;
(Continued)

(56) References Cited

U.S. PATENT DOCUMENTS

| 6,703,827 | B1 * | 3/2004 | Wolf | G01D 3/022 |
| | | | | 324/207.12 |
| 10,514,476 | B2 * | 12/2019 | Hahn | G01V 3/081 |

(Continued)

*Primary Examiner* — Farhana A Hoque
*Assistant Examiner* — Joseph O Nyamogo
(74) *Attorney, Agent, or Firm* — Tucker Ellis LLP

(57) ABSTRACT

A proximity sensor system and a method for implementing the proximity sensor system is provided, wherein the proximity sensor system includes a sensor article, wherein the sensor article includes a sensor sensing surface and wherein the sensor article is configured to sense the magnetic field of a target article located proximate the sensor sensing surface and generate a sensor signal, a temperature compensation article, wherein the temperature compensation article includes components configured to generate a predetermined TCA signal and a processor, wherein the processor is configured to process the sensor signal and the TCA signal and to generate a processor output signal.

20 Claims, 16 Drawing Sheets

(51) Int. Cl.
*G01D 3/036* (2006.01)
*G01D 5/14* (2006.01)
*G01R 33/07* (2006.01)

(52) U.S. Cl.
CPC ............ *G01D 5/145* (2013.01); *G01R 33/072* (2013.01); *G01R 33/0041* (2013.01)

(58) Field of Classification Search
CPC ..... H01H 2009/00; H01L 22/00; H01L 23/00; H01L 24/00; H01L 25/00; H01L 27/00; H01L 29/00; H01L 2223/00; H01L 2224/00; H01L 2924/00; H01R 9/00; H01R 12/00; H02M 1/00; H02M 3/00; H02M 7/00; H02M 2001/00; H02M 2003/00; H02P 5/00; H03B 5/00; H03D 3/00; H03D 7/00; H03F 1/00; H03F 3/00; H03F 2200/00; H03F 2203/00; H03G 1/00; H03G 3/00; H03H 7/00; H03H 11/00; H03H 19/00; H03J 1/00; H03J 3/00; H03J 2200/00; H03K 3/00; H03K 17/00; H03L 7/00; H03L 2207/00; H03M 1/00; H04B 17/00; H04L 27/00; H04R 3/00; H04R 29/00; H04W 24/00; H05K 1/00; H05K 3/00; H05K 7/00; G01B 5/00; G01B 7/00; G01B 21/00; G01D 3/00; G01D 5/00; G01D 5/145; G01D 3/0365; G01D 5/147; G01K 1/00; G01K 3/00; G01K 7/00; G01K 15/00; G01K 2219/00; G01L 1/00; G01L 5/00; G01L 9/00; G01L 21/00; G01M 3/00; G01M 13/00; G01M 15/00; G01N 3/00; G01N 17/00; G01N 21/00; G01N 25/00; G01N 27/00; G01N 33/00; G01N 2021/00; G01P 3/00; G01Q 60/00; G01R 1/00; G01R 3/00; G01R 15/00; G01R 19/00; G01R 22/00; G01R 27/00; G01R 29/00; G01R 31/00; G01R 33/00; G01R 35/00; G01R 33/0082; G01R 33/0041; G01R 33/072; G02F 1/00; G02F 2/00; G02F 2001/00; G02F 2201/00; G02F 2202/00; G02F 2203/00; G03G 15/00; G03H 1/00; G03H 2001/00; G03H 2226/00; G05D 23/00; G05F 3/00; G06F 3/00; G06F 17/00; G07C 9/00; G08B 17/00; G08B 21/00; G08B 29/00; G09G 3/00; G09G 2300/00; G09G 2320/00; G09G 2330/00; G09G 2360/00; G09G 2370/00

See application file for complete search history.

(56) References Cited

U.S. PATENT DOCUMENTS

| | | | | |
|---|---|---|---|---|
| 2011/0128014 | A1* | 6/2011 | Harrison | ................ G01D 5/202 |
| | | | | 324/601 |
| 2012/0086442 | A1* | 4/2012 | Haas | ..................... G01R 33/02 |
| | | | | 324/225 |
| 2015/0022187 | A1* | 1/2015 | Taylor | .................... G01D 5/147 |
| | | | | 324/207.13 |
| 2015/0323391 | A1* | 11/2015 | McCulloch | ........ G01N 33/0004 |
| | | | | 374/185 |
| 2016/0208763 | A1* | 7/2016 | Fernandez | ............. G01P 3/487 |
| 2018/0011140 | A1* | 1/2018 | Chaware | ............ G01R 31/2884 |

* cited by examiner

TEMPERATURE COMPENSATION METHOD FOR HALL EFFECT PROXIMITY SENSORS

FIELD OF THE INVENTION

The present invention relates generally to sensors for aerospace applications that operate based on the Hall Effect principle, and more particularly to an article and method for making these sensors fully-functional over a wide operating temperature range.

BACKGROUND OF THE INVENTION

In today's modern aircraft, there are many locations that require a positive position indication to ensure that safety conditions are met. One such example is the cabin door of an aircraft, wherein if the cabin door is not fully secured the safety of the passengers and crew is at risk. In fact, if the cabin door is not fully secured the survivability of the entire aircraft may be threatened. For example, an incorrect indication that the cabin door is secured may cause the aircraft to takeoff when the passenger cabin is not properly sealed. This can prevent the cabin Environmental Control System (ECS) from operating properly and thus, pressurization of the cabin may not occur as discussed below.

Another such example is the aircraft's Weight-On-Wheels (WOW) system. The WOW system typically utilizes safety critical proximity sensors (WOW sensors) that are configured to detect when a landing gear strut is fully-compressed. These WOW sensors may also be tied to a variety of additional complex systems such as brakes, aircraft pressurization, and spoilers. In fact, without the WOW sensors, the pilot may not know when the aircraft is in the air or on the ground. Failure of this type of switch could translate to the pilot being unable to retract the gear on takeoff because the system 'thinks' that the aircraft is still on the ground. Additionally, in turbine aircraft, the WOW sensors keep the pilot from pressuring the cabin while on the ground, and thus failure of this sensor may keep the pilot from pressuring the cabin in the air.

In some cases, aircraft systems use a hall effect sensor/switch that detects the position (proximity) of a metal target (object), wherein the metal target is constructed from a ferromagnetic material. FIG. 1 illustrates a general hall-effect sensor configuration. Unfortunately, however, hall effect sensors as proximity indicators typically only operate well over a narrow temperature range, such as −20° C. to +50° C. This is undesirable because the typical operating temperature range of aviation electronics can be between −55° C. to +125° C. One way to address this narrow operating range and 'force' proper operation over a wide temperature range is to employ special temperature compensation techniques, such as using an Application Specific Integrated Circuit (ASIC) with memory components, or a microcontroller with software. Unfortunately, employing these 'special temperature compensation techniques' make the hall effect sensors overly complicated and require a large investment to comply with aviation standard requirements, such as DO-254 and/or DO-178.

SUMMARY OF THE INVENTION

A proximity sensor system is provided and includes a sensor article, wherein the sensor article includes a sensor sensing surface and wherein the sensor article is configured to sense the magnetic field of a target article located proximate the sensor sensing surface and generate a sensor signal. The proximity sensor system further includes a temperature compensation article, wherein the temperature compensation article includes components configured to generate a predetermined TCA signal and a processor, wherein the processor is configured to process the sensor signal and the TCA signal and to generate a processor output signal.

A method for implementing a proximity sensor system is provided, wherein the proximity sensor system includes a sensor article, a temperature compensation article and a processor. The method includes generating first sensor output data for a target article located at a first distance away from the sensor article, generating second sensor output data for the target article located at a second distance away from the sensor article; processing the first sensor output data and the second sensor output data to generate threshold data and configuring the temperature compensation article to generate an output signal responsive to the threshold data. The method further includes calculating the digital data responsive to the threshold data, introducing the digital data into the plurality of DACs to generate a TCA output signal, generating sensor operating data, wherein the sensor operating data is generated by operating the sensor article across an operational temperature range and processing the threshold data and the sensor operating data to generate processor output data.

A method for generating a proximity system output signal for a proximity sensor system is provided, wherein the proximity sensor system includes a sensor article, a temperature compensation article and a processor. The method includes operating the sensor article to generate first sensor output data, wherein the first sensor output data is responsive to the sensor article sensing the magnetic field of a magnetic target article across a predefined temperature range and located at a first distance away from the sensor article, operating the sensor article to generate second sensor output data, wherein the second sensor output data is responsive to the sensor article sensing the magnetic field of a magnetic target article across the predefined temperature range and located at a second distance away from the sensor article and processing the first sensor output data and the second sensor output data to generate threshold data. The method further includes configuring the temperature compensation article to generate an TCA output signal responsive to the threshold data, generating sensor operating data, wherein the sensor operating data is generated by operating the sensor article across an operational temperature range, wherein the operational temperature range is within the predefined temperature range and comparing the TCA output signal and the sensor operating data to generate at least one of a high signal and a low signal.

BRIEF DESCRIPTION OF THE DRAWINGS

The foregoing and other features and advantages of the present invention should be more fully understood from the accompanying detailed description of illustrative embodiments taken in conjunction with the following Figures in which like elements are numbered alike in the several Figures.

DETAILED DESCRIPTION

Figure 1A:
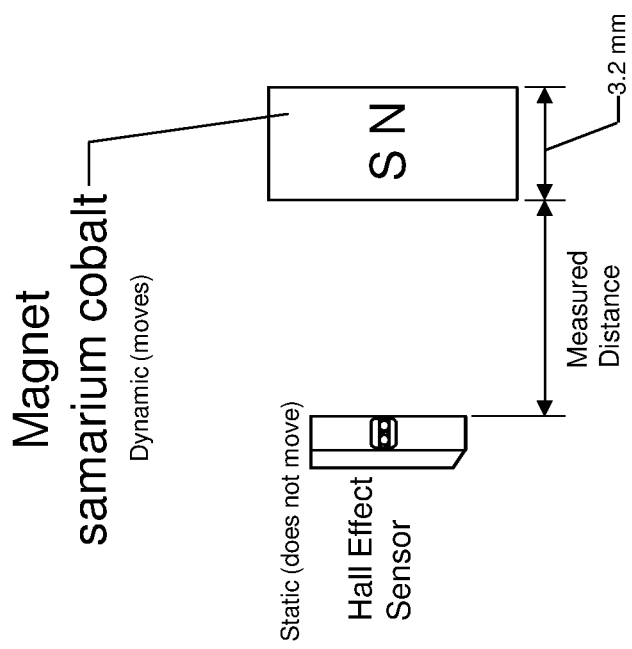
FIG. 1A is a schematic block diagram showing a hall-effect based sensor, in accordance with the prior art.
Figure 1B:
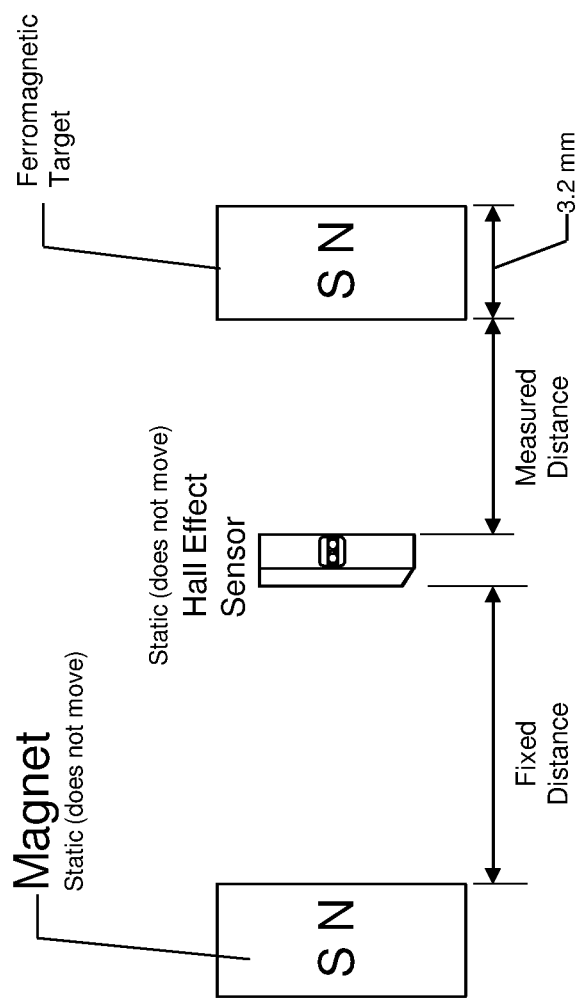
FIG. 1B is a schematic block diagram showing a hall-effect based sensor system with Ferromagnetic Material as Target, in accordance with one embodiment of the invention.

As discussed hereinafter and in accordance with the present invention, a hall-effect based proximity sensor and a method for implementing a hall-effect based proximity sensor is provided, wherein the hall-effect based proximity sensor uses analog techniques to achieve proper operation over a wider temperature range than is currently achievable and which will not require a large investment to comply with applicable aviation standards, such as DO-254 and/or DO-178. Hall effect sensors operate on the presence or absence of a magnetic field, wherein the magnetic field is supplied by a discrete magnet and a ferromagnetic target is used as the sensing target. Referring to FIG. 1B, the present invention achieves hall-effect sensing by packaging a discrete magnet inside the body of the sensor, which imparts a constant magnetic bias on a chip. Then, when a ferromagnetic target comes in close proximity to the chip, the magnetic field is altered, which allows for the creation of signals that indicate the location of the target relative to the sensor (i.e. 'near' and 'far' signals).

Figure 2:
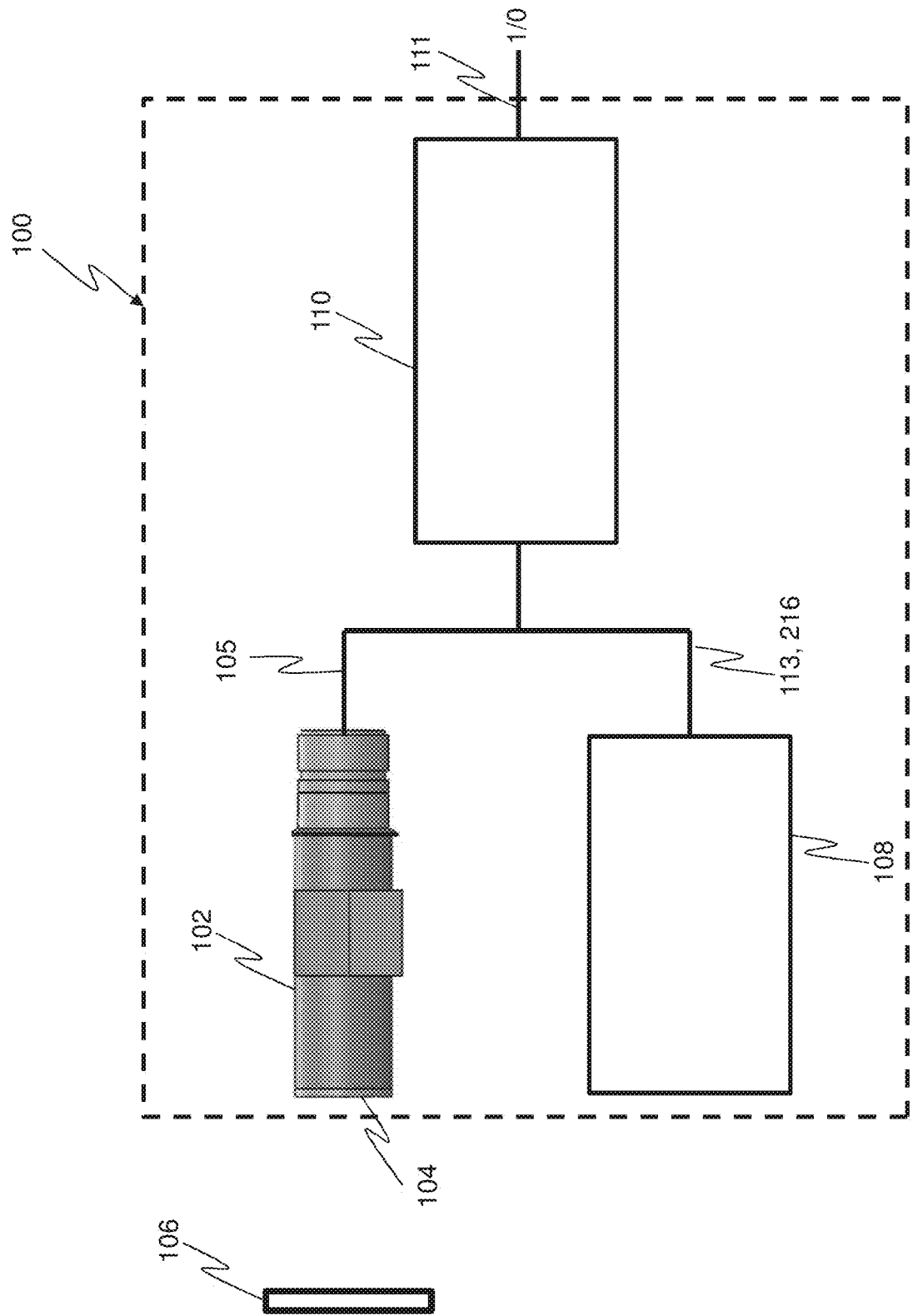
FIG. 2 is a schematic block diagram showing a hall-effect based proximity sensor system, in accordance with one embodiment of the present invention.
Figure 3:
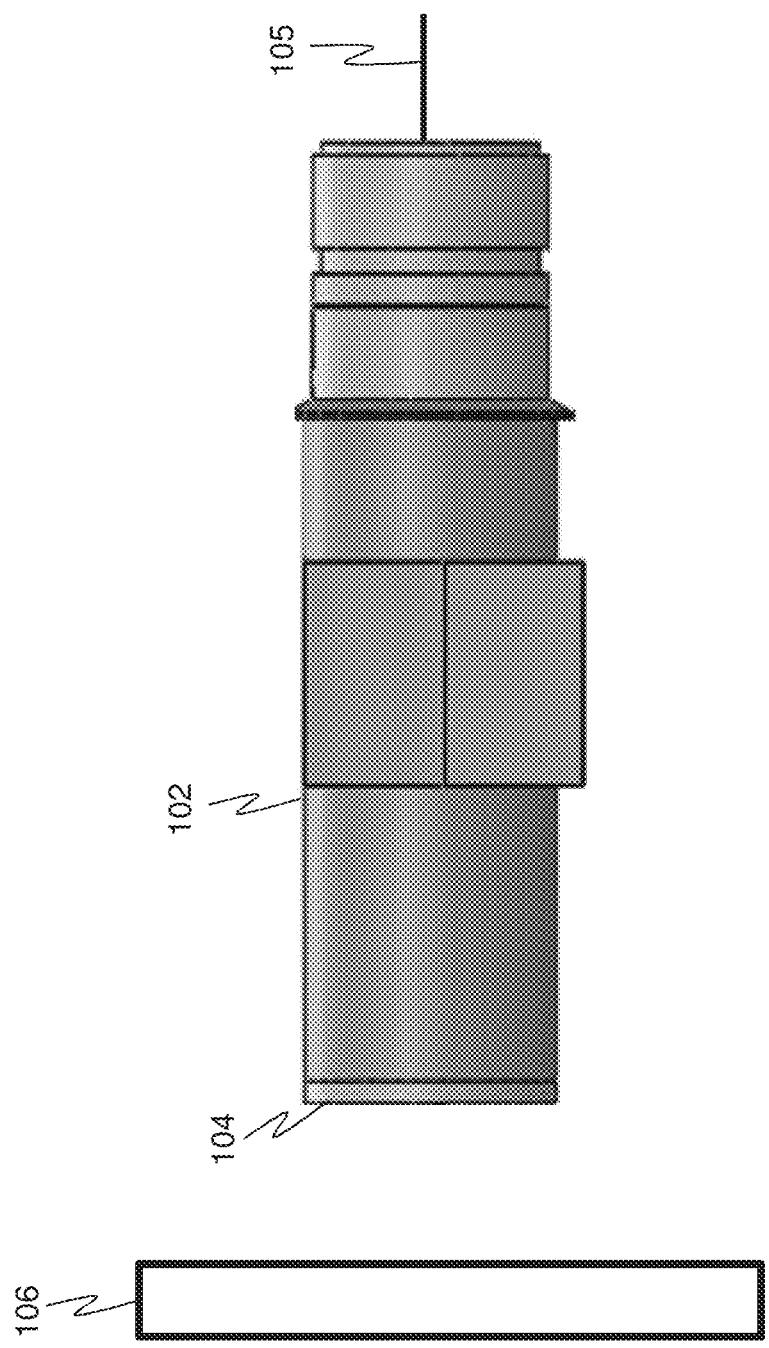
FIG. 3 is a schematic block diagram showing a sensor article of the hall-effect based proximity sensor system of FIG. 2, in accordance with one embodiment of the present invention.
Figure 4:
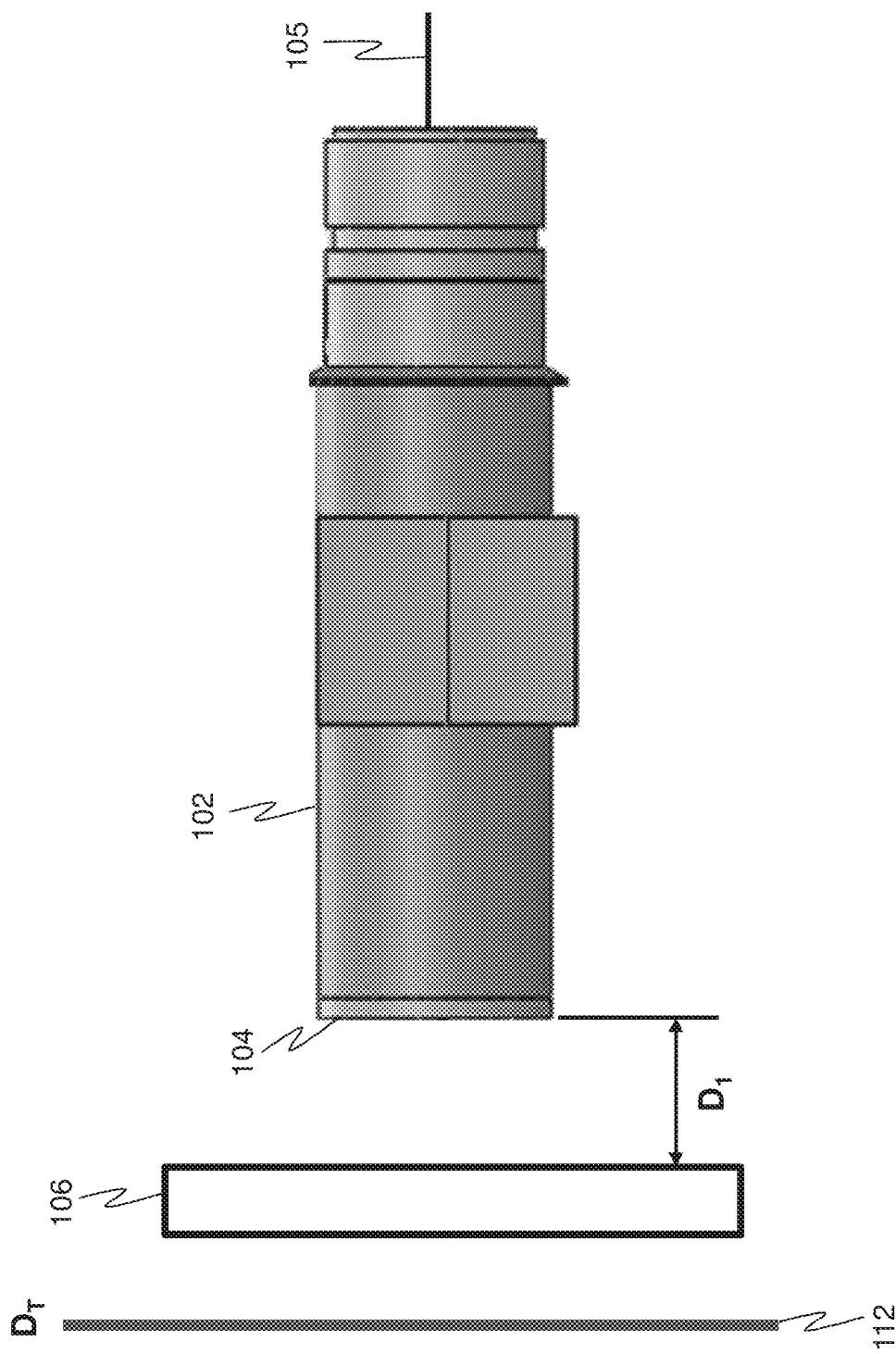
FIG. 4 is a schematic block diagram showing a sensor article of the hall-effect based proximity sensor system of FIG. 2, with the target article located closer to the sensor article than the threshold distance.
Figure 5:
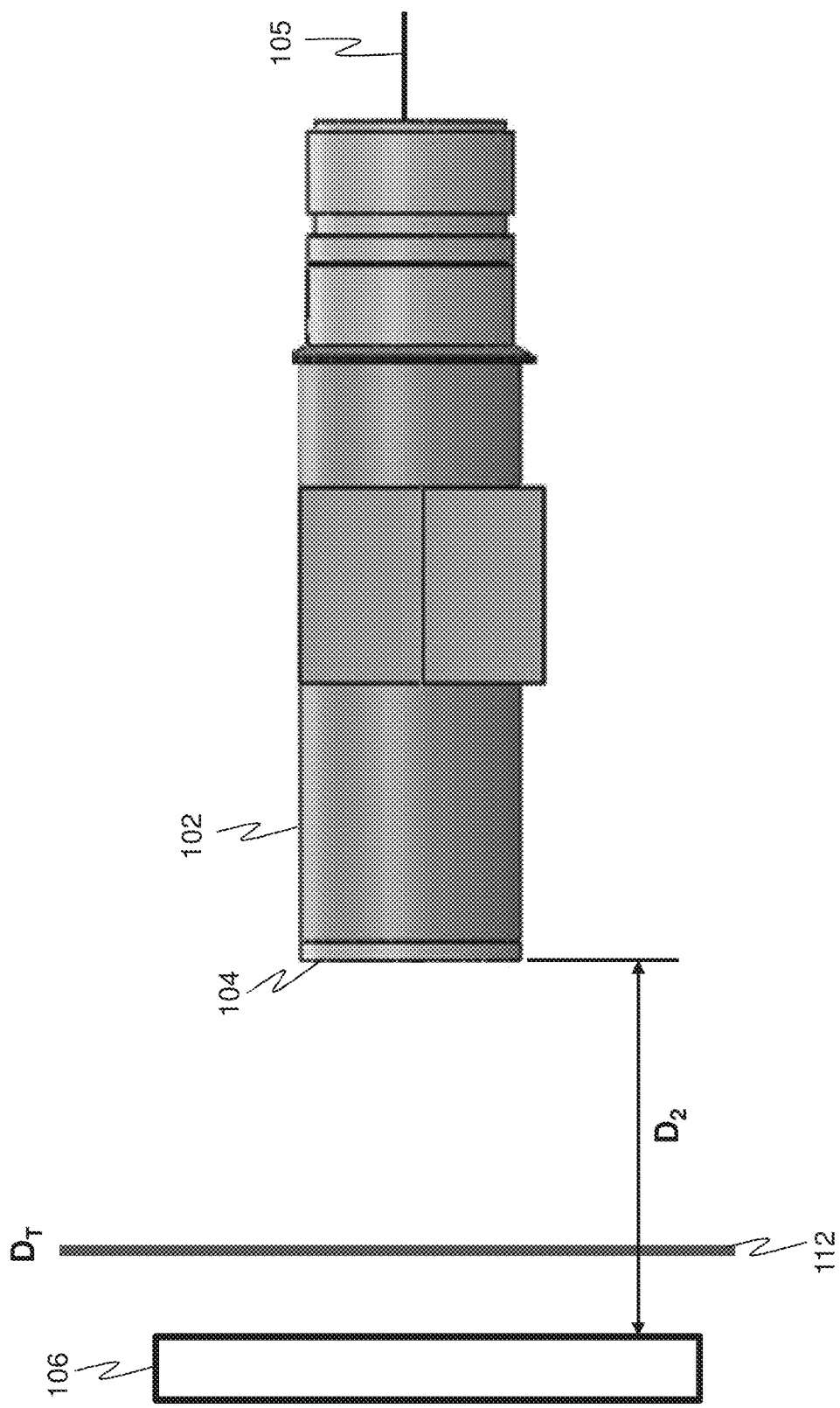
FIG. 5 is a schematic block diagram showing a sensor article of the hall-effect based proximity sensor system of FIG. 2, with the target article located farther from the sensor article than the threshold distance.

In accordance with one embodiment of the present invention, referring to FIG. 2 and FIG. 3, a schematic block diagram of a hall-effect based proximity sensor system 100 is shown and includes a sensor article 102 having a sensor sensing surface (datum) 104 and a sensor output 105, a ferromagnetic (metal) target article 106, a Temperature Compensation Article (TCA) 108 and a processing module 110 having a processing module output signal 111. It should be appreciated that the hall-effect based proximity sensor system 100 is configured such that the sensor article 102 senses the proximity of the target article 106 relative to a distance away from the sensor sensing surface (datum) 104. Referring to FIG. 4, when the target article 106 is at a distance $D_1$ which is relatively close to the datum 104, the sensor article 102 will sense the higher magnetic field generated by the closeness of the target article 106 to the datum 104 and generate a first signal which will indicate that the target article 106 is close to the datum 104 (i.e. "TARGET NEAR" signal). Referring to FIG. 5, when the target article 106 is at a distance $D_2$ which is relatively far from the datum 104 (i.e. farther then distance $D_1$), the sensor article 102 will sense the lower magnetic field generated by the larger distance of the target article 106 from the datum 104 and generate a second signal which will indicate that the target article 106 is far from the datum 104 (i.e. "TARGET NEAR" signal).

It should be appreciated that although the invention is disclosed herein as having the convention that a higher (or stronger) magnetic field is associated with a closer target and a lower (or weaker) magnetic field is associated with a farther target, other embodiments may employ any convention suitable to the desired end purpose. For example, in another embodiment, the invention may be configured such that a higher (or stronger) magnetic field may be associated with a farther target and a lower (or weaker) magnetic field may be associated with a closer target. It should be appreciated that, in one embodiment, the sensor article 102 generates an analog signal proportional to the magnetic field which is directly related to the distance between the sensor sensing surface (datum) 104 and the target article 106. It should be further appreciated that the output of the sensor article 102 may be analog (i.e. continuous) indicating distance and/or the output of the sensor article 102 may be discrete to function as a proximity switch. Accordingly, it is contemplated that the sensor article may be configured to simultaneously or non-simultaneously sense distance and proximity if desired. Moreover, although the hall-effect based proximity sensor system 100 is disclosed herein as the sensor article 102 being separate from the Temperature Compensation Article (TCA) 108 and the processing module 110, it is contemplated that the sensor article 102 the Temperature Compensation Article (TCA) 108 and the processing module 110 may all be packaged within the same enclosure.

Figure 6A:
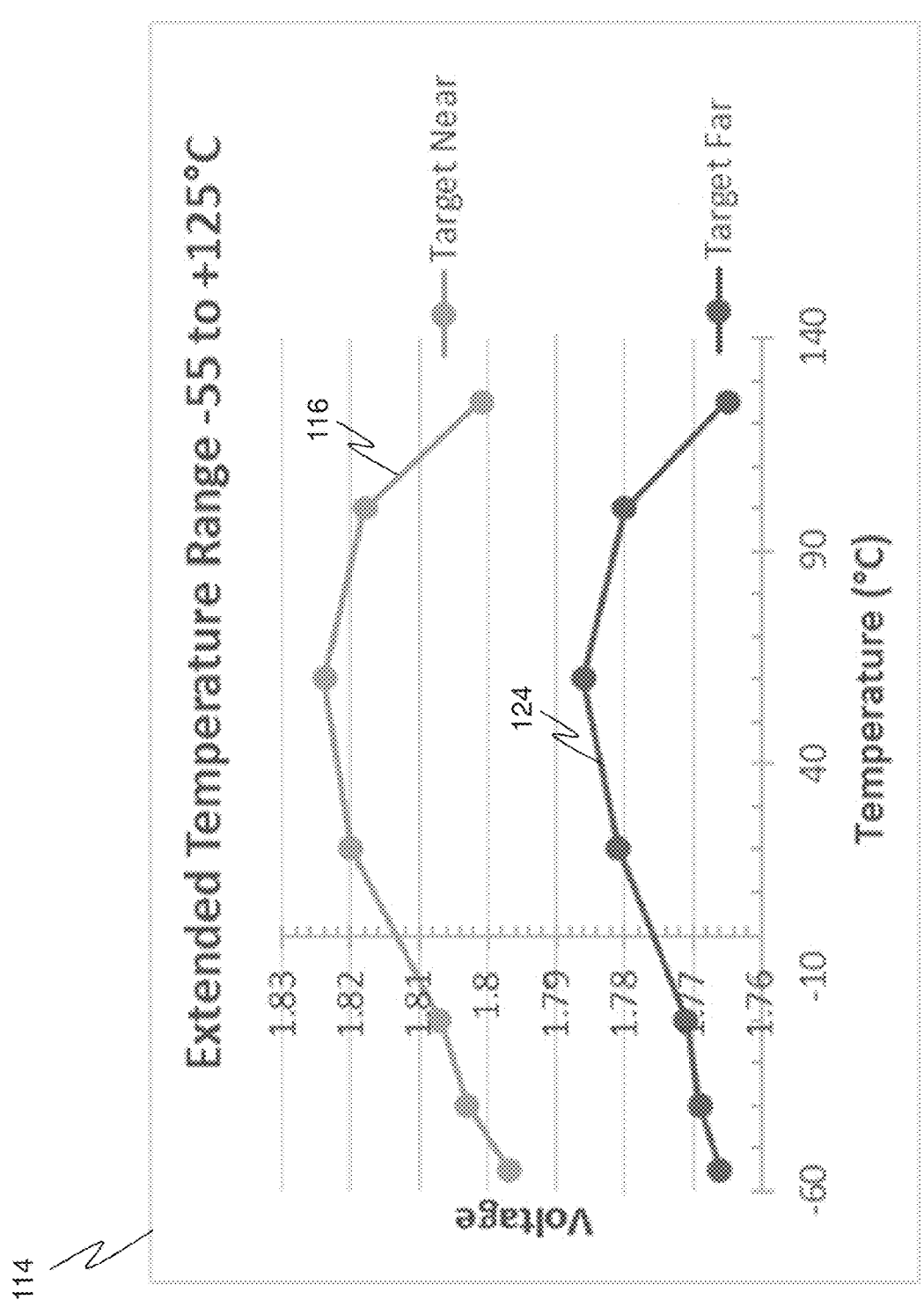
FIG. 6A illustrates the signal output of the sensor article of the hall-effect based proximity sensor system of FIG. 2 for seven (7) temperatures and two distances from the target, in accordance with one embodiment of the invention.

Referring to FIG. 6A, a graph 114 showing the output signal of one embodiment of the sensor article 102 for seven (7) different temperatures between about −55° C. and +125° C. at two (2) different distances (target near, target far) is provided. It should be appreciated that, in general, in this embodiment the closer the target article 106 is to the datum 104, the higher the magnetic field sensed by the datum 104. Likewise, in general, in this embodiment the farther the target article 106 is from the datum 104, the lower the magnetic field sensed by the datum 104. As can be seen in FIG. 6A, the sensor article 102 is configured to generate a higher voltage with a higher magnetic field (the target article 106 is closer than the threshold distance 112) and a lower voltage with a lower magnetic field (the target article 106 is farther than the threshold distance 112). It should be appreciated that in another embodiment, the sensor article 102 may be configured to have an opposite signal polarity. As such the sensor article 102 may be configured to generate a lower voltage with a higher magnetic field (the target article 106 is closer than the threshold distance 112) and a higher voltage with a lower magnetic field (the target article 106 is farther than the threshold distance 112).

Figure 7:
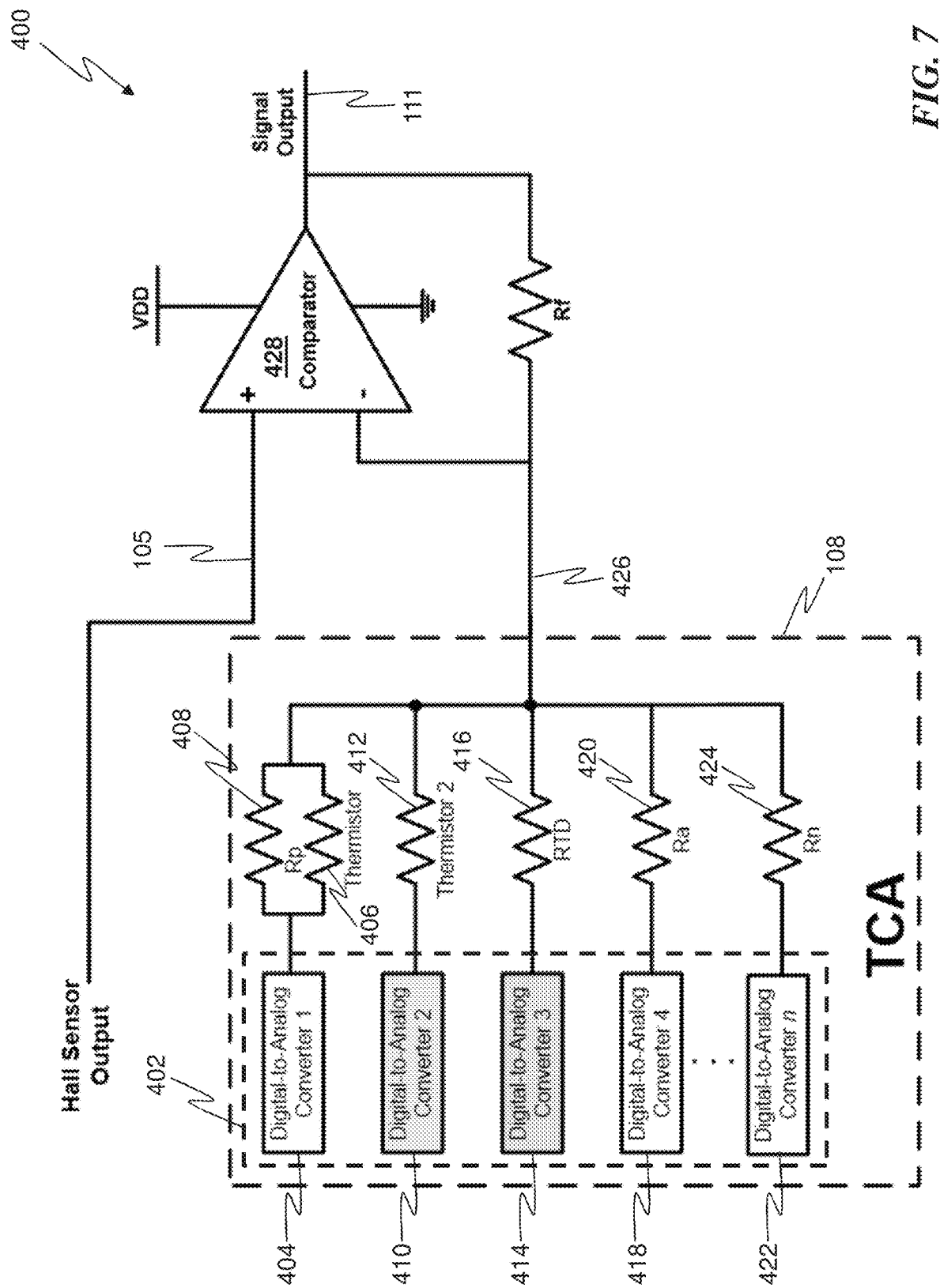
FIG. 7 is a schematic block diagram of a Temperature Compensation Article (TCA) for use with the hall-effect based proximity sensor system of FIG. 2, in accordance with yet another embodiment of the invention.

Referring to FIG. 7, one embodiment of the hall-effect based proximity switch system 100 is shown and uniquely provides for accuracy in generating the desired non-linear switching threshold point between the "TARGET NEAR" and "TARGET FAR" signals. The TCA 108 of the hall-effect based proximity switch system 100 includes a plurality of Digital-to-Analog Converters (DACs) 402 and includes a first DAC 404, a first thermistor 406 and a first biasing resistor 408, wherein the first thermistor 406 and the first biasing resistor 408 are connected in a parallel configuration and the first DAC 404 is connect to the first thermistor 406 and the first biasing resistor 408 in a series configuration. The hall-effect based proximity switch system 400 further includes a second DAC 410 and a second thermistor 412, wherein the second DAC 410 and second thermistor 412 are connected in a series configuration.

Figure 8:
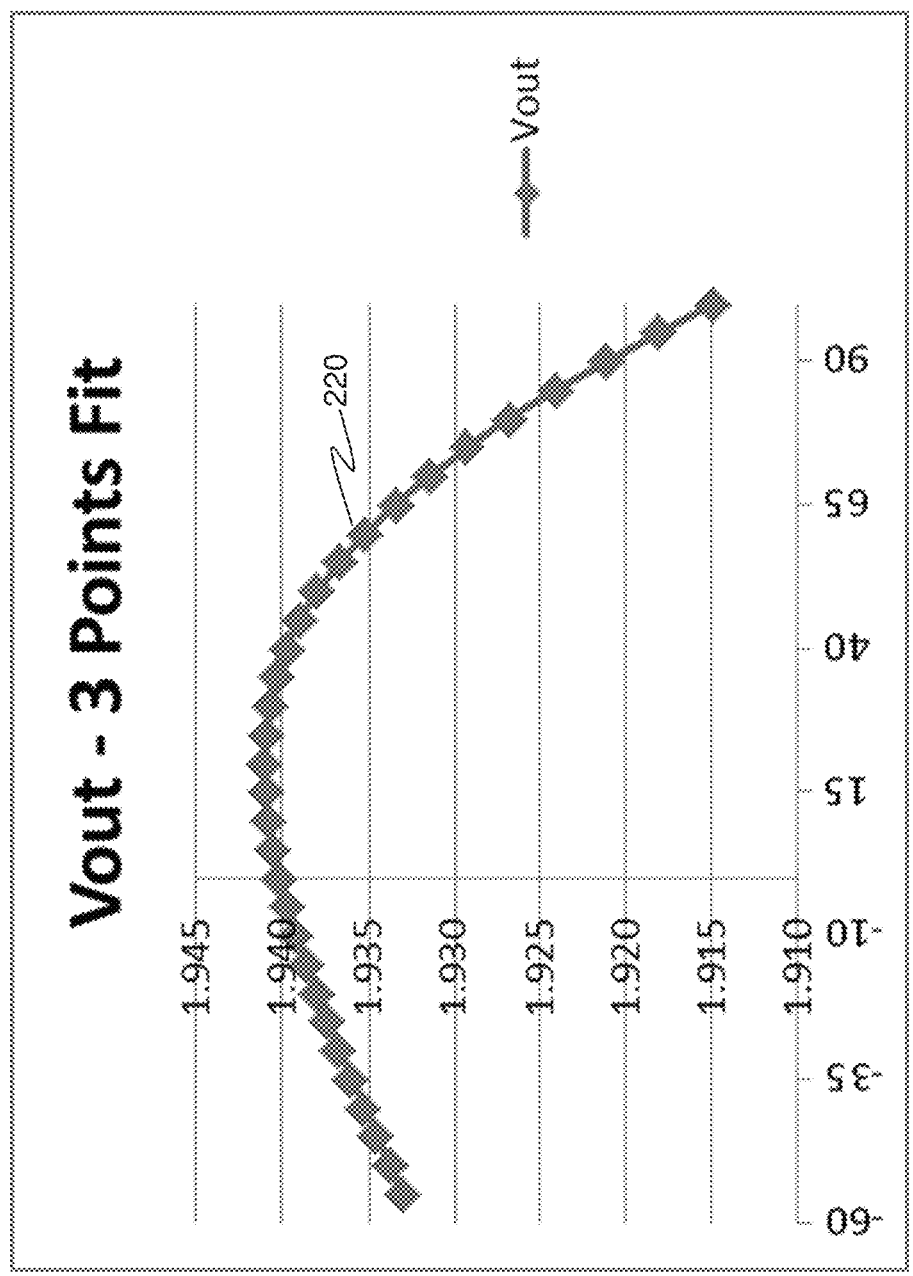
FIG. 8 is a graph illustrating the output of the Temperature Compensation Article (TCA) of FIG. 7.

Additionally, the TCA 108 further includes a third DAC 414 and a Resistive Temperature Detector (RTD) 416, wherein the third DAC 414 and RTD 416 are connected in a series configuration. The TCA 108 also includes a fourth DAC 418 and a second biasing resistor 420, wherein the fourth DAC 418 and the second biasing resistor 420 are connected in a series configuration. The outputs of the first thermistor 406 and first biasing resistor 408 combination, second thermistor 412, RTD 416 and the second biasing resistor 420 are connected together as output $V_{Out}$ 426. It should be appreciated that any number of DACs and biasing resistors may be used as desired. For example, in FIG. 7 a fifth DAC 422 and a third biasing resistor 424 is shown as 'DACn' and 'Rn' respectively to indicate that 'n' number of DAC's and 'n' number of biasing resistors may be used if desired. The output $V_{Out}$ 426 and the sensor output 105 is then introduced into a processing circuitry, such as comparator 428 having a feedback resistor Rf, wherein the comparator 428 is configured to generate a digital output signal 111 which is at least one of high and low. This digital output signal 111 may then be introduced into the aircraft system as the proximity signal. Referring to FIG. 8, a graph illustrating the output threshold signal 220 of the TCA article 108 of FIG. 7 at signal output 426 is shown. It should be appreciated that this threshold signal 220 is responsive to the selection of the components of the TCA article 108 and thus can be predetermined based on the selection of the components of the TCA article 108.

It should be appreciated that in this embodiment, the five (5) DACs 404, 410, 414, 418, 422 are used to generate five (5) bias points which are summed together to form output $V_{Out}$. A mathematical analysis is performed to select appropriate output values from each of the DACs 404, 410, 414, 418, 422, which in turn is dependent upon the values selected for the first thermistor 406, the second thermistor 412, the first biasing resistor 408, the second biasing resistor 420, the third biasing resistor 424 and the RTD 416. It should be further appreciated that this embodiment includes three (3) additional biasing points than TCA article 300, wherein the three (3) additional control points that are used to generate the desired non-linear threshold point and advantageously allows the ability to create the desired function in a manner which eliminates the manual resistor selection as well as results in a close to near-perfect function fit.

It should be appreciated that in one embodiment, the TCA article 300 may be configured by operating the sensor article 102 across a predefined temperature range with a magnetic target article at a first distance away from sensor (such as Target Near) to generate first sensor output data (analog). The sensor article 102 may then be operated across the predefined temperature range with the magnetic target article at a second distance away from the sensor (such as Target Far) to generate second sensor output data (analog). Threshold data may then be generated by averaging the first sensor output data and the second sensor output data. The components (i.e. resistor values, temperature dependent resistor values, etc.) of the TCA article 300 may then be selected responsive to the threshold data, wherein the values of these components may have already been optimized, i.e. the exact NTC thermistors (with correct betas), RTDs and resistor used. The digital values that are to be introduced into the EEPROM registers of the DAC's 402 to achieve the desired TCA output 426 may be calculated and the TCA output 426 may be compared with the real time sensor data 105 to generate a high or low signal output 111. Basically, once the threshold voltage has been calculated from the far and near locations, equations are solved to yield the DAC 402 settings. These DAC 402 settings are then loaded and stored in the EEPROM of each device (here using I2C). These DACs 402 may have some type of memory to hold these values for the life of the part.

It should be appreciated that the TCA article 300 may be configured via any method and/or using any components suitable to the desired end purpose. In one embodiment, the component values may be optimized to reproduce any nonlinear function. And depending on how the non-linear behavior is, some DAC and resistive components may be eliminated altogether, if desired. The mathematical solution will tell which DACs are needed or not needed. For example, equations to calculate DAC output voltages for 7 different temperatures are shown immediately hereinafter:

$$\frac{Vrv - Vthr\_n40}{Rv} + \frac{Vrtd - Vthr\_n40}{RTDn40} +$$
$$\frac{Vntca - Vthr\_n40}{NTCan40} + \frac{Vntcb - Vthr\_n40}{NTCbn40} + \frac{0 - Vthr\_n40}{Rg} = 0$$

$$\frac{Vrv - Vthr\_n20}{Rv} + \frac{Vrtd - Vthr\_n20}{RTDn20} +$$
$$\frac{Vntca - Vthr\_n20}{NTCan20} + \frac{Vntcb - Vthr\_n20}{NTCbn20} + \frac{0 - Vthr\_n20}{Rg} = 0$$

$$\frac{Vrv - Vthr\_0}{Rv} + \frac{Vrtd - Vthr\_0}{RTD0} +$$
$$\frac{Vntca - Vthr\_0}{NTCa0} + \frac{Vntcb - Vthr\_0}{NTCb0} + \frac{0 - Vthr\_0}{Rg} = 0$$

$$\frac{Vrv - Vthr\_p20}{Rv} + \frac{Vrtd - Vthr\_p20}{RTDp20} +$$
$$\frac{Vntca - Vthr\_p20}{NTCap20} + \frac{Vntcb - Vthr\_p20}{NTCbp20} + \frac{0 - Vthr\_p20}{Rg} = 0$$

-continued $$\frac{Vrv - Vthr\_p40}{Rv} + \frac{Vrtd - Vthr\_p40}{RTDp40} +$$

$$\frac{Vntca - Vthr\_p40}{NTCap40} + \frac{Vntcb - Vthr\_p40}{NTCbp40} + \frac{0 - Vthr\_p40}{Rg} = 0$$

$$\frac{Vrv - Vthr\_p60}{Rv} + \frac{Vrtd - Vthr\_p60}{RTDp60} +$$

$$\frac{Vntca - Vthr\_p60}{NTCap60} + \frac{Vntcb - Vthr\_p60}{NTCbp60} + \frac{0 - Vthr\_p60}{Rg} = 0$$

$$\frac{Vrv - Vthr\_p70}{Rv} + \frac{Vrtd - Vthr\_p70}{RTDp70} +$$

$$\frac{Vntca - Vthr\_p70}{NTCap70} + \frac{Vntcb - Vthr\_p70}{NTCbp70} + \frac{0 - Vthr\_p70}{Rg} = 0$$

$$\begin{pmatrix} xVrv \\ xVrtd \\ xVntca \\ xVntcb \end{pmatrix} := Minerr(Vrv, Vrtd, Vntca, Vntcb)$$

$Vrv := xVrv = 2.0261$ $Vntca := xVntca = 1.4054$ $Vrtd := xVrtd = 1.6812$ $Vntcb := xVntcb = 1.9274$ Wherein, Vthr_x are the calculated threshold voltages, Vrv is the voltage out of DAC 418 with the fixed resistor 420, Vrtd is the voltage out of DAC 414 with RTD 416, Vntca is the voltage with the NTCa thermistor 406 and Vntcb is the voltage with the NTCb thermistor 412.

Once these voltages are known, the DAC 402 settings can be calculated (here shown as 12-bit DACs and a DAC reference voltage of 5 VDC) as shown immediately hereinafter:

$$DACrv := Round\left(\frac{Vrv}{Vref} \cdot 4096, 1\right) = 1660.0$$

$$DACrtd := Round\left(\frac{Vrtd}{Vref} \cdot 4096, 1\right) = 1377.0$$

$$DACntca := Round\left(\frac{Vntca}{Vref} \cdot 4096, 1\right) = 1151.0$$

$$DACntcb := Round\left(\frac{Vntcb}{Vref} \cdot 4096, 1\right) = 1579.0,$$

Wherein DACrv=DAC 418, DACrtd=DAC 414, DACntca=DAC 404 and DACntcb=DAC 410.

It should be appreciated that in one embodiment, the electronic architecture of the TCA article 300 may employ 12-bit digital-to-analog (DAC) converters 402, along with a pt500 RTD 416, a 10 k resistor for fixed resistor Ra 420, an NTC thermistor 412 with a β 25/50 coefficient of 3380, and an NTC thermistor 406 with a β 25/50 coefficient 4386K in parallel with a 10 k resistor 408. Any suitable combination of positive and negative coefficient resistive devices, some with parallel or series fixed resistors, can be used to achieve any desired non-linear voltage output 426.

Referring again to FIG. 4, FIG. 5, FIG. 6A and FIG. 7, the graph 114 includes a first signal trace 116 that represents the output of the sensor article 102 for multiple temperatures between about −55° C. and about +125° C. at first distance $D_1$, when the target article 106 is relatively close to the datum 104. The graph 114 further includes a second signal trace 124 that represents the output of the sensor article 102 for multiple temperatures between about −55° C. and about +125° C. when the target article 106 is at second distance $D_2$, wherein the second distance $D_2$ is farther away from the datum 104 than the first distance $D_1$. It will be noticed that the same temperature data points were used to create the first signal trace 116 and the second signal trace 124.

Figure 6B:
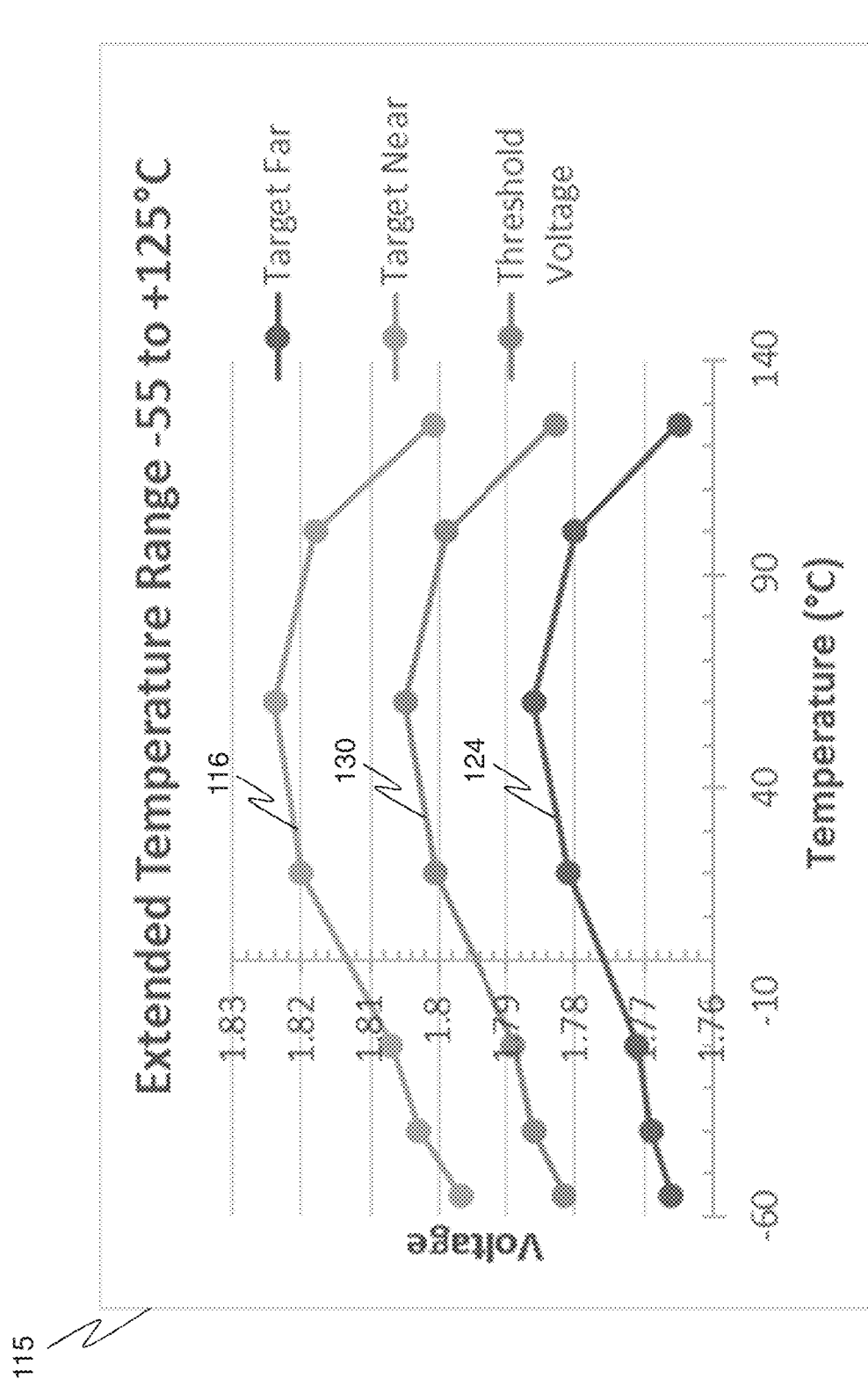
FIG. 6B illustrates the signal output of the sensor article of the hall-effect based proximity sensor system of FIG. 2 for seven (7) temperatures and two distances from the target along with the calculated threshold signal, in accordance with one embodiment of the invention.

Once the first signal trace 114 and second signal trace 124 are generated, a threshold or third signal trace 130 is calculated, wherein the threshold or third signal trace 130 represents an 'average' of the first signal trace 114 and second signal trace 124. Referring to FIG. 6B, a graph 115 is provided and includes first signal trace 114, second signal trace 124 and third signal trace 130 which represents the threshold signal that is calculated using the data from the first signal trace 116 and the data from the second signal trace 124. It should be appreciated that although in one embodiment the third signal trace 130 is calculated by averaging the first signal trace 116 and the second signal trace 124, any method for generating third signal trace 130 may be used.

It should also be appreciated that the third signal trace 130 is representative of the target article 106 being located at a threshold distance $D_T$ away from the datum 104, wherein the threshold distance $D_T$ is located between the first distance $D_1$ and the second distance $D_2$. It should be appreciated that although only seven (7) temperatures were used to generate the first signal trace 116 and second signal trace 124 above, any number of temperatures as desired may be used. It should be appreciated that in accordance with one embodiment of the invention, the TCA 108 is then configured to generate a signal output 113 that resembles the threshold or third signal trace 130, wherein this threshold signal trace 130 represents and is very similar to the third signal trace 130 across a range of temperatures between about −55° C. and about +125° C.

Figure 9:
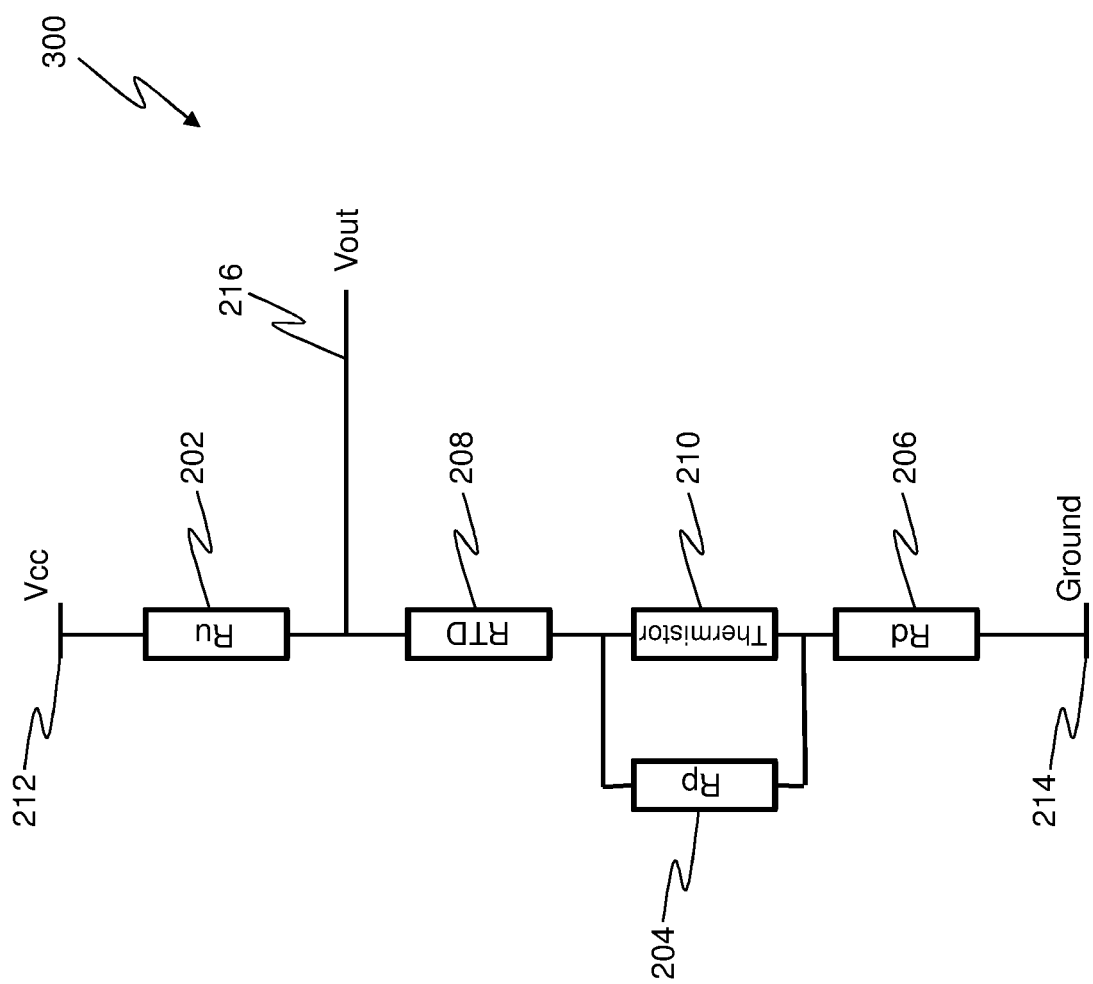
FIG. 9 is a schematic block diagram of the Temperature Compensation Article (TCA) of the hall-effect based proximity sensor system of FIG. 2, wherein the components of the TCA are selected to generate an output similar to the threshold output of FIG. 6B, in accordance with one embodiment of the invention.

In accordance with one embodiment of the invention, the TCA 108 may be configured to generate the threshold signal trace by selecting an appropriate combination of components used in the TCA 108 that are necessary to produce the threshold signal trace 130. It should be appreciated that the selection of the combination of components may be determined using common circuit equations. Referring to FIG. 9, another embodiment of TCA 300 is shown and includes a first biasing resistor 202, a second biasing resistor 204, a third biasing resistor 206, a Resistive Temperature Detector (RTD) 208 and a thermistor article 210, wherein one or more of the biasing resistors 202, 204, 206 may be fixed and/or variable resistors. Additionally, it will be noted that in this embodiment the first biasing resistor 202, third biasing resistor 206, Resistive Temperature Detector (RTD) 208 and thermistor article 210 are connected in series configuration and the second biasing resistor 204 is connected in parallel with the thermistor article 210. Although in one embodiment the RTD 300 may be a component that has a linear dependence on temperature and increases its resistance with an increase in environmental temperature, it should be appreciated that any positive temperature coefficient device may be used as desired, such as, for example a PTC in conjunction with a parallel resistor. Moreover, the thermistor article 210 is preferably a component that has a non-linear dependence on temperature and decreases its resistance with an increase in environmental temperature.

It should be appreciated that appropriate selection of the values for biasing resistors 202, 204 and 206 may provide the capability to create virtually any non-linear and non-monotonic function of temperature desired regardless of whether the RTD 300 and the thermistor article 210 are connected together in parallel and/or series. Additionally, it should be appreciated that the TCA article 300 may further include a first signal input 212, a second signal input 214 and a signal output 113, 216, wherein for the TCA article 300 shown in FIG. 9, the first signal input 212 is shown as Vcc and the second signal input 214 is shown as ground.

Figure 10:
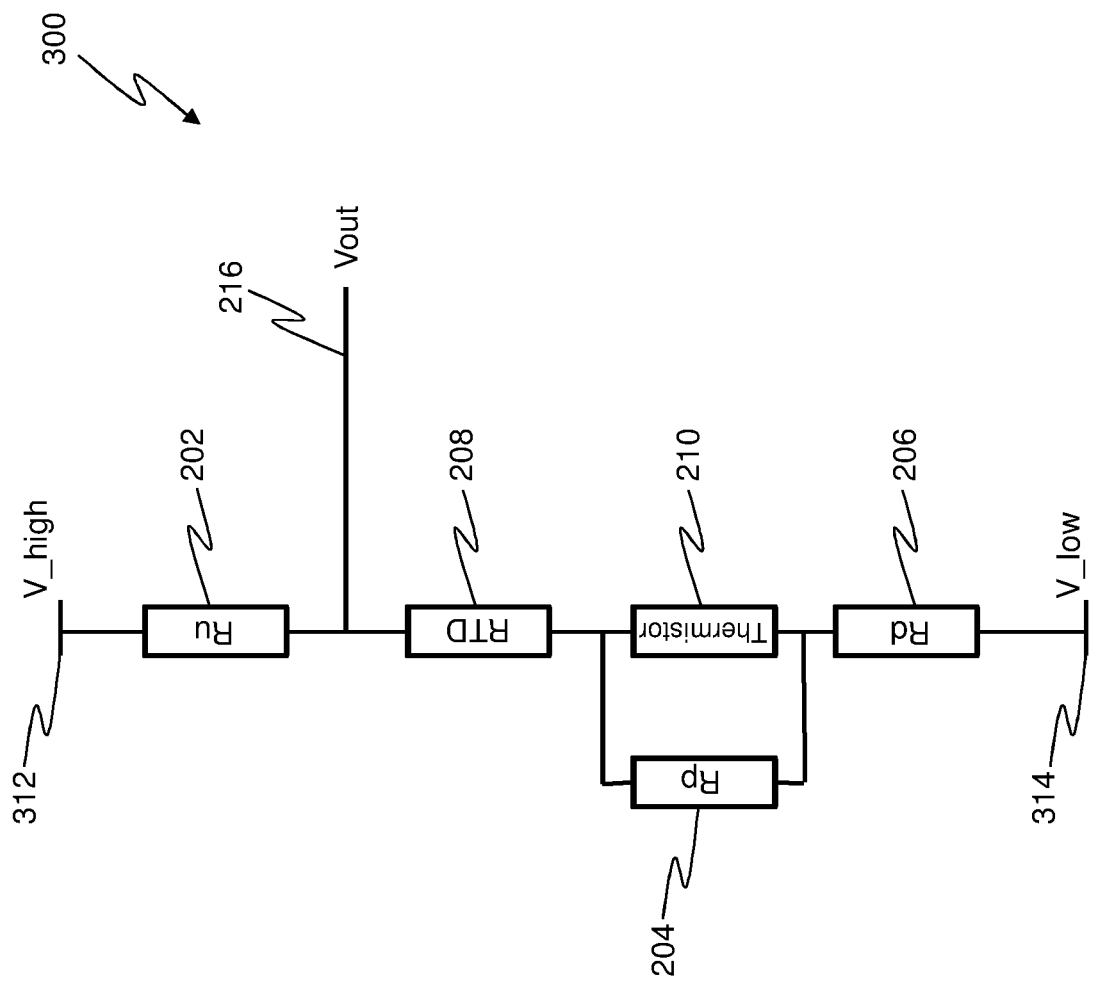
FIG. 10 is a schematic block diagram of the Temperature Compensation Article (TCA) of the hall-effect based proximity sensor system of FIG. 2, in accordance with another embodiment of the invention.

Referring to FIG. 10, the TCA article 300 is shown in accordance with another embodiment, wherein the first signal input 312 is shown as $V_{High}$ and the second signal input 314 is shown as $V_{Low}$. It is contemplated that $V_{High}$ and $V_{Low}$ may be set to any voltage level desired via any method suitable to the desired end purpose, such as a standard potentiometer (such as trim-pot) or by a programmable potentiometer. It should be appreciated that this method advantageously reduces the need to implement non-standard resistor values my combining multiple resistors together by programming the potentiometer(s) to the desired value(s).

It should be appreciated that in accordance with the present invention, the desired threshold signal 220 can be determined by taking measurements 1) from a sensor 102 across a temperature range of about −55° C. (±15%) and about +125° C. (±15%) while the target article was located at a distance near (i.e. $D_1$) to the datum 104) from a sensor across a temperature range of about −55° C. (±15%) and about +125° C. (±15%) while the target article was located at a distance far (i.e. $D_2$, where D2>D1) from the datum 104, and 3) averaging the data collect at $D_1$ and at $D_2$ for each of the temperature points. It should also be noted that the threshold signal 220 of the TCA article 108 closely resembles the third signal trace 130 (i.e. at the threshold distance 112) in FIG. 6 and therefore represents a temperature dependent, non-linear, non-monotonic function response which matches the hall-effect Sensor output at the threshold distance 112 (i.e. third signal trace 130). Accordingly, since the threshold signal 220 of the TCA article 108 matches the third signal trace 130, this indicates that the hall-effect based proximity switch system 100 will properly operate as a proximity sensor over a wide range of temperatures ranging from about −55° C. (±15%) to about +125° C. (±15%). It should be appreciated that the present invention is operable over across a temperature range that exceeds about −55° C. to about +125° C. In fact, the temperature operating range of the present invention is determined by the operating ranges of the components used to implement the TCA article 108 (i.e. signal conditioning electronics, power input electronics, etc.) and thus, is theoretically unlimited. For example, an operating range of about −273° C. to about +650° C. is possible if the components used to implement the invention are able to operate in such an environment. Furthermore, it is contemplated that in one embodiment, a high temperature magnet may be used.

It should be appreciated that in this embodiment, the five (5) DACs 404, 410, 414, 418, 422 are used to generate five (5) bias points which are summed together to form output $V_{Out}$. A mathematical analysis is performed to select appropriate output values from each of the DACs 404, 410, 414, 418, 422, which in turn is dependent upon the values selected for the first thermistor 406, the second thermistor 412, the first biasing resistor 408, the second biasing resistor 420, the third biasing resistor 424 and the RTD 416. It should be further appreciated that this embodiment includes three (3) additional biasing points than TCA article 300, wherein the three (3) additional control points that are used to generate the desired non-linear threshold point and advantageously allows the ability to create the desired function in a manner which eliminates the manual resistor selection as well as results in a close to near-perfect function fit.

Figure 11:
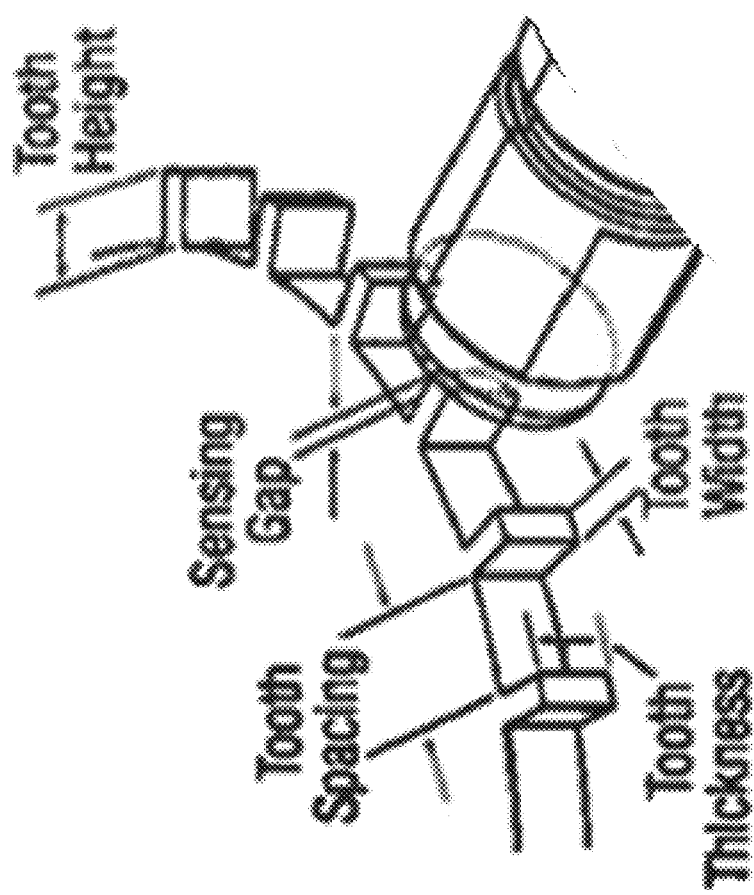
FIG. 11 shows the hall-effect based proximity sensor system of FIG. 2, being configured as a speed sensor, in accordance with one embodiment of the invention.
Figure 12:
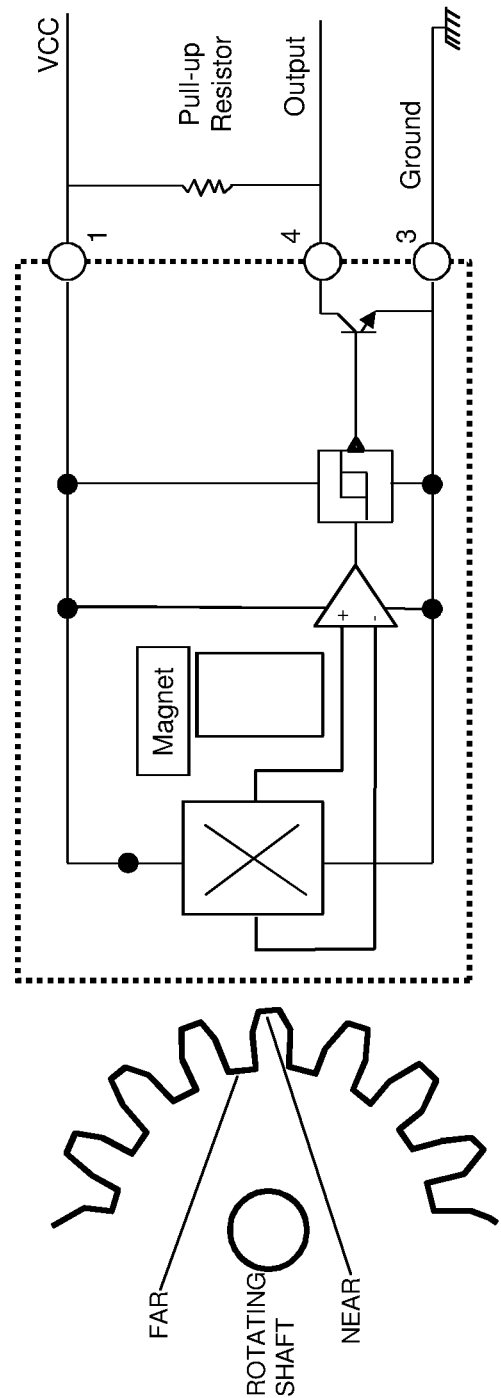
FIG. 12 shows the hall-effect based proximity sensor system of FIG. 2, being configured as a speed sensor, in accordance with one embodiment of the invention.

Furthermore, referring to FIG. 11, it is contemplated that in other embodiments, the hall-effect based proximity sensor system 100, 400 may also be configured to operate as a speed sensor, wherein the sensor article 102 can be configured to measure the rotating speed of a shaft. In this embodiment, a ferromagnetic gear may be rigidly attached to the shaft, wherein the revolution speed of the gear may (or may not) be the same as that of the shaft (i.e. geared up or down). Referring to FIG. 11 and FIG. 12, the ferromagnetic gear may have a predefined number of teeth, wherein the outer diameter or width surface of each tooth may act to generate a "TARGET NEAR" signal. Additionally, each of the cavities (i.e. tooth spacing) between the gear teeth may act to generate a "TARGET FAR" signal. Thus, as the gear rotates, the hall-effect based proximity sensor system 100, 400 'detects' the "TARGET NEAR" and "TARGET FAR" conditions and generates an alternating signal which can be used to measure the rotation speed (frequency of the sensor output may be proportional to the gear revolution speed).

Figure 13:
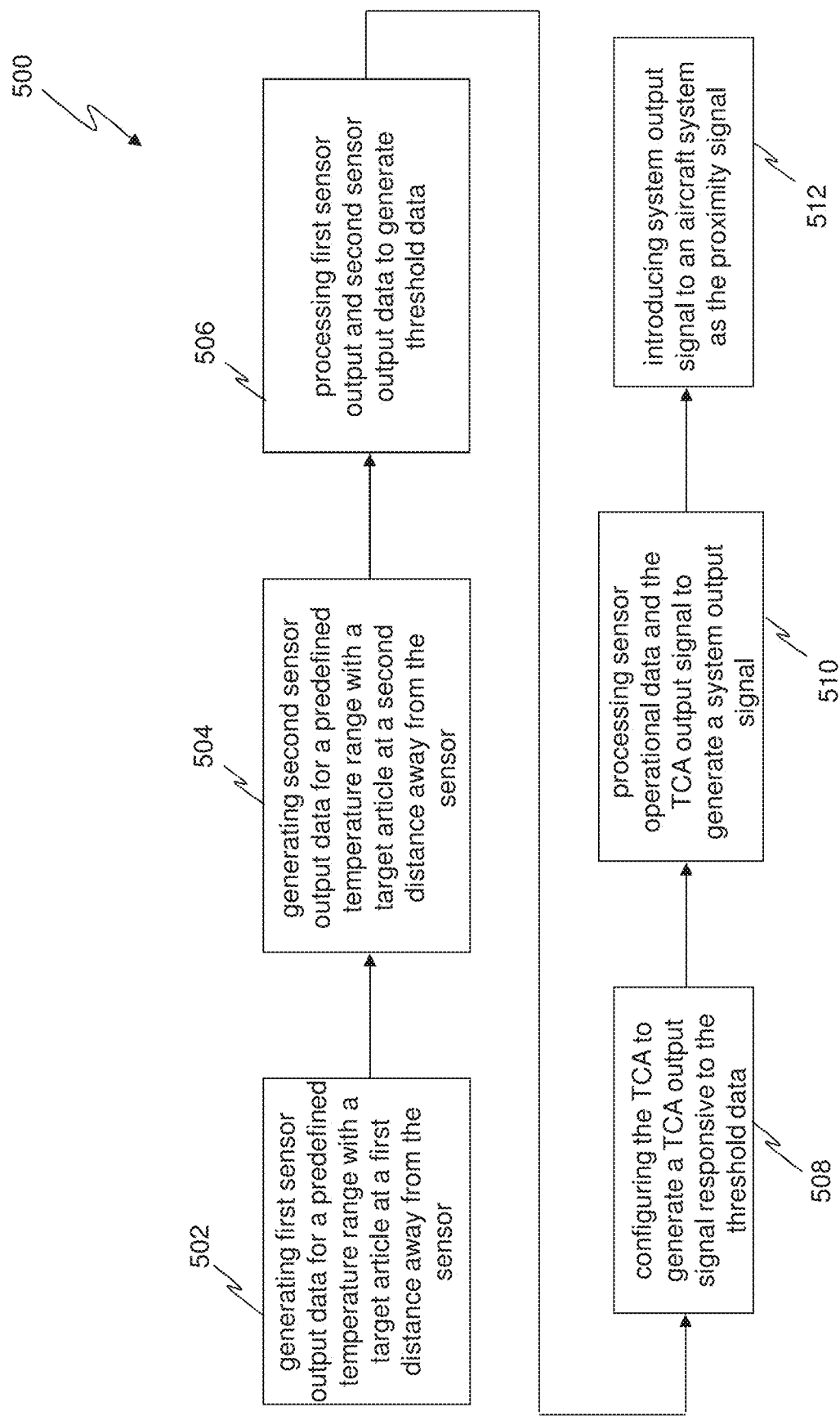
FIG. 13 shows an operational block diagram illustrating a method for implementing the hall-effect based proximity sensor system of FIG. 2, in accordance with one embodiment of the invention.

In accordance with an additional embodiment of the invention, referring to FIG. 13, an operational block diagram illustrating a method 500 for implementing a hall-effect based proximity switch system 100, 400, having a sensor article 102 with a datum 104, a sensor output 105, a ferromagnetic target 106, a TCA 108 and a processor 110 is provided and includes generating first sensor output data for a predefined temperature range with a target article at a first distance away from the sensor article 102, as shown in operational block 502. This may be accomplished by positioning the target article at a first distance away from the sensor article 102 and operating the sensor article 102 at varying temperatures across the predefined temperature range and recording the first sensor output data for one or more temperatures.

The method 500 further includes generating second sensor output data for the predefined temperature range with a target article at a second distance away from the sensor article 102, as shown in operational block 504, wherein the first distance is not equal to the second distance. This may be accomplished by positioning the target article at a second distance away from the sensor article 102 and operating the sensor article 102 at varying temperatures across the predefined temperature range and recording the second sensor output data for one or more temperatures. It should be appreciated that although it is contemplated that the same or similar temperature points are used to generate first sensor output data and second sensor output data, other embodiments may use different temperature points.

The method 500 includes processing the first sensor output data and the second sensor output data to generate threshold data, as shown in operational block 506. This may be accomplished by averaging the output data for each of the temperature points of the first and second sensor output data. The method 500 further includes configuring the TCA 108 to generate an output signal that is very similar to the threshold data across a predefined temperature range, as shown in operational block 508. This may be accomplished by designing the TCA 108 with the appropriate components necessary to produce TCA output data that is similar or exact to the threshold data across the predefined temperature range.

Furthermore, the method 500 includes configuring the processor 110 to process the threshold data and sensor data (as the sensor is operating in its installed environment) to generate a system output signal 111, as shown in operational block 510, wherein the system output signal 111 may be at least one of a high signal and a low signal. In one embodiment, this may be accomplished via comparing the sensor data with the threshold data and if the sensor data is greater than or equal to the threshold data for a particular temperature, the system output signal 111 may be high (or low), else the system output signal 111 may be low (or high). In another embodiment, this may be accomplished via comparing the sensor data with the threshold data and if the sensor data is less than or equal to the threshold data for a particular temperature, the system output signal may be high (or low), else the system output signal 111 may be low (or high). The method 500 further includes introducing the system output signal 111 to an aircraft system as the proximity signal, as shown in operational block 512.

Figure 14:
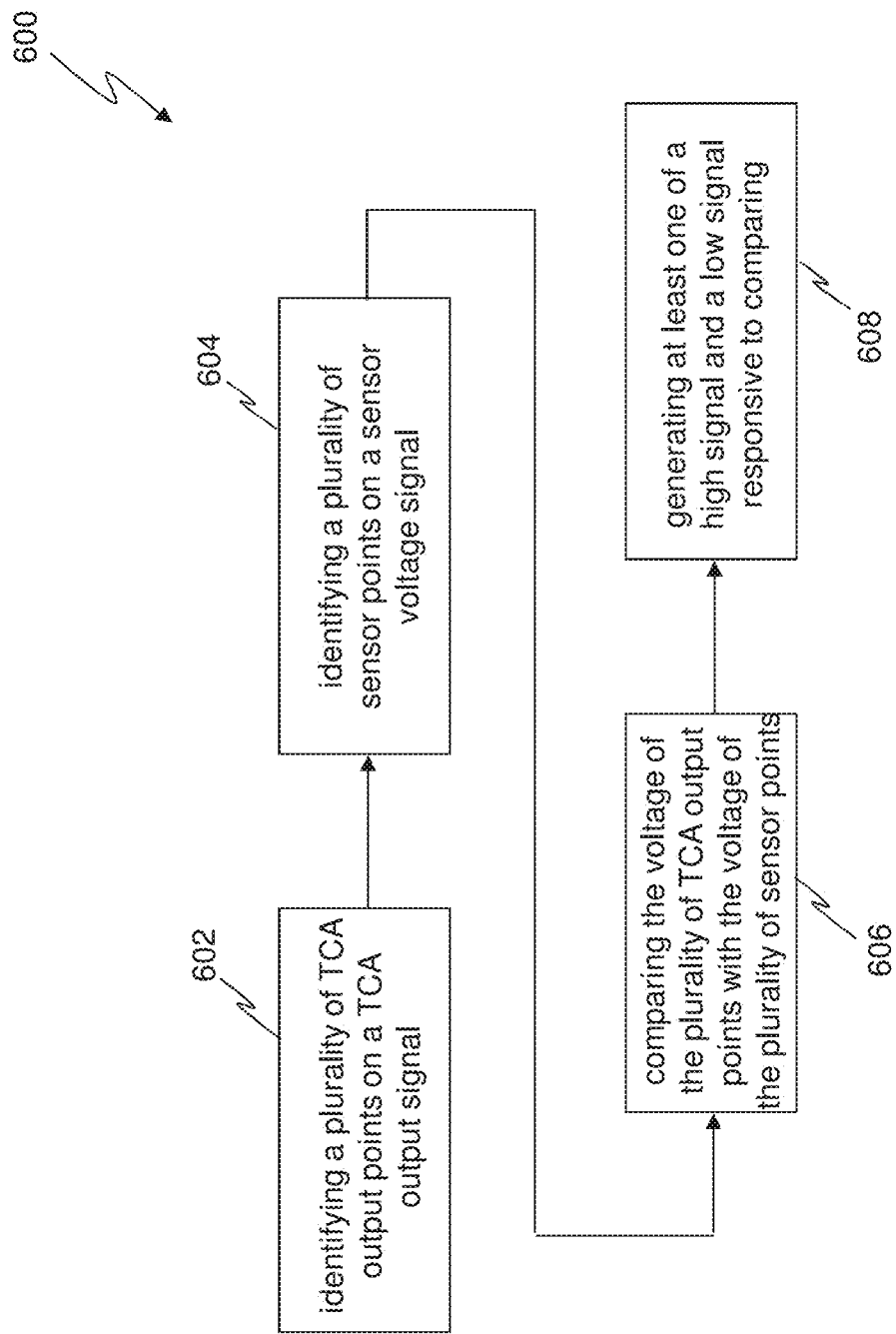
FIG. 14 shows an operational block diagram illustrating a method for generating a processed sensor signal, in accordance with one embodiment of the invention.

It should be appreciated that in one embodiment, the system output signal 111 may be generated via a comparator that compares the sensor signal 105 to the threshold signal 220. Referring to FIG. 14, an operational block diagram illustrating a method 600 for generating a proximity system output signal 111 is shown and includes identifying a plurality of threshold points on a threshold signal 220, as shown in operational block 602, wherein each of the plurality of threshold points corresponds to a specific temperature across a temperature range of about −55° C. to about +125° C. It should be appreciated that the threshold signal 220 may be generated in response to a TCA article 108 that was designed with components that were specifically selected to cause the TCA article 108 to generate a voltage output signal across a wide temperature range having desired characteristics. For example, in one embodiment, it is desired to have a TCA output signal with defined voltage versus temperature characteristics across a temperature range of about −55° C. to about +125° C. One such signal is shown in FIG. 8, wherein the signal was calculated as discussed herein above.

The method 600 further includes identifying a plurality of sensor points on a sensor signal, as shown in operational block 604, as the sensor is operating in its installed environment and wherein each of the plurality of sensor points corresponds to a specific temperature within a temperature range which is between about −55° C. to about +125° C., wherein the plurality of threshold points and the plurality of sensor points correspond to the same (or similar) temperature values. The method 600 further includes comparing the voltage of the threshold points with the voltage of the sensor points at the same or similar temperature values, as shown in operational block 606. The method 600 further includes, for each of the temperature values, generating at least one of a high and a low signal, as shown in operational block 608, and as discussed herein above.

While the invention has been described with reference to an exemplary embodiment, it should be understood by those skilled in the art that various changes may be made and equivalents may be substituted for elements thereof without departing from the scope of the invention. Moreover, the embodiments or parts of the embodiments may be combined in whole or in part without departing from the scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. A proximity sensor system, comprising:
    a proximity sensor article, wherein the proximity sensor article includes a sensor sensing surface and wherein the proximity sensor article is configured to operate based, at least in part, on the hall-effect principal to sense the magnetic field of a target article located proximate the sensor sensing surface and generate an analog sensor signal;
    a temperature compensation article including a plurality of temperature dependent resistors coupled to respective digital-to-analog converters, the digital-to-analog converters being configured to receive digital data responsive to predetermined threshold data, and the temperature compensation article being configured to generate a non-linear analog TCA signal responsive to the predetermined threshold data; and
    a processor, wherein the processor is a comparator configured to use analog techniques to achieve proper operation of the proximity sensor article over a predetermined operating temperature range by comparing the analog sensor signal and the non-linear analog TCA signal to generate a processor output signal, wherein the processor output signal is at least one of a digital high signal and a digital low signal and is introduced into the aircraft system as a proximity signal.

2. The proximity sensor system of claim 1, wherein the sensor signal is generated responsive to the location of the target article relative to the sensor sensing surface.

3. The proximity sensor system of claim 1, wherein the sensor signal is generated in response to a plurality of target article locations across the predetermined operating temperature range.

4. The proximity sensor system of claim 3, wherein the operating temperature range is between about −55° C. and about +125° C.

5. The proximity sensor system of claim 1, wherein the TCA signal is determined by generating a first sensor signal with the target article located at a first location across a predefined temperature range, generating a second sensor signal with the target article located at a second location across the predefined temperature range and averaging the first and second sensor signals across the predefined temperature range.

6. The proximity sensor system of claim 5, wherein the predefined temperature range is between about −55° C. and about +125° C.

7. The proximity sensor system of claim 1, wherein the temperature compensation article includes a first biasing resistor, a second biasing resistor, a third biasing resistor, a Resistive Temperature Detector (RTD) and a thermistor article, wherein the first biasing resistor, third biasing resistor, Resistive Temperature Detector (RTD) and thermistor article are connected in series configuration and the second biasing resistor is connected in parallel with the thermistor article.

8. The proximity sensor system of claim 7, wherein one or more of the first biasing resistor, second biasing resistor and third biasing resistor are at least one of a fixed resistor or a variable resistor.

9. A method for implementing a proximity sensor system, wherein the proximity sensor system includes a proximity sensor article that is configured to operate based, at least in part, on the hall-effect principal, a temperature compensation article including a plurality of DACs, and a processor, the method comprising:

generating first sensor output data for a target article located at a first distance away from the sensor article;

generating second sensor output data for the target article located at a second distance away from the sensor article;

processing the first sensor output data and the second sensor output data to generate threshold data;

configuring the proximity sensor system to generate an output signal responsive to the threshold data and the temperature compensation article;

calculating the digital data responsive to the threshold data;

introducing the digital data into the plurality of DACs to generate a TCA output signal;

generating sensor operating data, wherein the sensor operating data is generated by operating the sensor article across an operational temperature range using analog techniques to achieve proper operation over the operational temperature range; and processing the threshold data and the sensor operating data to generate a processor output signal, wherein the processor output signal is at least one of a digital high signal or a digital low signal.

10. The method of claim 9, further including introducing the processor output signal into an aircraft system.

11. The method of claim 9, wherein processing includes comparing the sensor operating data with the threshold data to generate at least one of a digital high signal and a digital low signal.

12. The method of claim 9, wherein the second distance away from the proximity sensor article is larger than the first distance away from the proximity sensor article.

13. The method of claim 9, wherein the target article includes a target magnetic portion and wherein the proximity sensor article senses the magnetic field of the target magnetic portion.

14. The method of claim 9, wherein generating the first sensor output data and the second sensor output data include operating the proximity sensor article across the operational temperature range.

15. The method of claim 9, wherein the operational temperature range is between about −55° C. and about +125° C.

16. The method of claim 9, wherein configuring includes selecting electrical components of the TCA and connecting the electrical components together to generate a TCA output signal responsive to the threshold data, wherein the threshold data is determined by averaging the first sensor output data and the second sensor output data.

17. A method for generating a proximity system output signal for a proximity sensor system in an aircraft, wherein the proximity sensor system includes a digital sensor article which is configured to operated, based at least in part, on the hall-effect principal, a temperature compensation article including a plurality of DACs and a processor being a comparator, the method comprising:

operating the digital sensor article to generate first sensor output data, wherein the first sensor output data is responsive to the digital sensor article sensing the magnetic field of a magnetic target article across a predefined temperature range and located at a first distance away from the digital sensor article;

operating the digital sensor article to generate second sensor output data, wherein the second sensor output data is responsive to the digital sensor article sensing the magnetic field of a magnetic target article across the predefined temperature range and located at a second distance away from the digital sensor article;

processing the first sensor output data and the second sensor output data to generate threshold data;

configuring the temperature compensation article to generate a non-linear analog TCA output signal responsive to the threshold data;

generating sensor operating data, wherein the sensor operating data is generated by operating the digital sensor article across an operational temperature range using analog techniques, wherein the operational temperature range is within the predefined temperature range; and comparing the non-linear analog TCA output signal and the sensor operating data to generate a processor output signal, wherein the processor output signal is at least one of a digital high signal and a digital low signal.

18. The method of claim 17, wherein the predefined temperature range is between about −55° C. and about +125° C.

19. The method of claim 17, wherein the method further including introducing the processor output signal into an aircraft system.

20. The method of claim 17, wherein the temperature compensation article including a plurality of temperature dependent resistors coupled to respective digital-to-analog converters.

* * * * *